(12) United States Patent
Perry et al.

(10) Patent No.: US 7,539,911 B2
(45) Date of Patent: May 26, 2009

(54) TEST MODE FOR PROGRAMMING RATE AND PRECHARGE TIME FOR DRAM ACTIVATE-PRECHARGE CYCLE

(75) Inventors: Robert Perry, Cary, NC (US); Norbert Rehm, Apex, NC (US); Jan Zieleman, Cary, NC (US); Rath Ung, Apex, NC (US)

(73) Assignee: Infineon Technologies AG, Neubiberg (DE)

( * ) Notice: Subject to any disclaimer, the term of this patent is extended or adjusted under 35 U.S.C. 154(b) by 364 days.

(21) Appl. No.: 11/138,462

(22) Filed: May 27, 2005

(65) Prior Publication Data

US 2006/0282718 A1 Dec. 14, 2006

(51) Int. Cl.
*G11C 29/00* (2006.01)
(52) U.S. Cl. ............... 714/718; 365/201; 360/53
(58) Field of Classification Search ............. 714/718, 714/724; 365/201, 200; 360/53
See application file for complete search history.

(56) References Cited

U.S. PATENT DOCUMENTS

| | | | | |
|---|---|---|---|---|
| 5,301,278 A * | 4/1994 | Bowater et al. | ............ | 711/5 |
| 6,061,285 A * | 5/2000 | Tsukikawa | ............ | 365/201 |
| 6,215,723 B1 * | 4/2001 | Kang et al. | ............ | 365/230.06 |
| 6,430,096 B1 * | 8/2002 | Grass | ............ | 365/201 |
| 6,459,635 B1 * | 10/2002 | Mullarkey et al. | ............ | 365/201 |
| 6,470,467 B2 * | 10/2002 | Tomishima et al. | ............ | 714/744 |
| 6,473,828 B1 * | 10/2002 | Matsui | ............ | 711/104 |
| 6,490,222 B2 * | 12/2002 | Choi et al. | ............ | 365/230.06 |
| 6,868,020 B2 * | 3/2005 | Aoki | ............ | 365/200 |
| 7,057,961 B2 * | 6/2006 | Perner | ............ | 365/222 |
| 7,243,276 B2 * | 7/2007 | Norris et al. | ............ | 714/719 |
| 2004/0008560 A1 * | 1/2004 | Aoki | ............ | 365/222 |
| 2004/0013016 A1 * | 1/2004 | Yamazaki et al. | ............ | 365/201 |
| 2004/0190352 A1 * | 9/2004 | Watanabe et al. | ............ | 365/191 |
| 2005/0018507 A1 | 1/2005 | Schroder et al. | | |

* cited by examiner

*Primary Examiner*—Esaw T Abraham
(74) *Attorney, Agent, or Firm*—Edell, Shapiro & Finnan, LLC

(57) ABSTRACT

A programmable activate-precharge cycle are provided for a DRAM device. Activate and precharge signals associated with the activate-precharge cycle are generated on the basis of the programmed rate and precharge time with respect to an internal clock of the DRAM device. The activate and precharge signals are coupled to wordlines of the DRAM device, and switched from one wordline to another under internal or external control. One or more functions of the DRAM device are tested while the activate and precharge signals are coupled to wordline. The manner in which switching the activate and precharge signals from one wordline to another wordline is configured depending on the type of testing to be conducted.

43 Claims, 4 Drawing Sheets

TEST MODE FOR PROGRAMMING RATE AND PRECHARGE TIME FOR DRAM ACTIVATE-PRECHARGE CYCLE

FIELD OF THE INVENTION

This invention relates to dynamic random access memory (DRAM) devices, and more particularly to techniques to increase the rate at which tests can be conducted on DRAM devices.

BACKGROUND OF THE INVENTION

DRAM devices are subjected to numerous tests at various stages of manufacture. Tests are conducted on a wafer of DRAM integrated circuits (ICs) during production, and at the chip level after wafer slicing. Certain common DRAM tests are called wordline (WL) toggle tests and critical row precharge time ($T_{RP}$) tests.

WL toggle tests are time consuming in nature and typically run on Test During Burn In (TBDI) systems that operate at clock speeds of a few MHz, whereas the DRAM device clock speeds are continually increasing and already at the hundreds of MHz. Thus, current methods for burn-in WL toggle testing are limited by the slow clock rate of the TBDI systems since toggling of WLs is simply a sequence of activate (ACT) and precharge (PRE) commands as shown in FIG. 1. For example, the clock rate of a typical TBDI system is approximately 5 MHz and for a wafer test system is approximately 60 MHz. Currently, DRAMs have clock rates of 333 MHz clock and greater. FIG. 1 shows that the row address is incremented by one, but it should be understood that any row address increment sequence is possible. The rate of testing with existing testing techniques cannot approach the normal operation rate of the DRAM device. Similarly, in wafer test devices are limited in their testing speed because they are driven by a clock that is much slower than the clock rate of the chips on the wafer.

It is desirable to provide a test mode or programmable feature of a DRAM device that facilitates much faster testing during ACT-PRE cycles of the DRAM device, and is not limited by the clock rate of the test equipment.

SUMMARY OF THE INVENTION

Briefly, a programmable activate-precharge cycle is provided for a DRAM device. Activate and precharge signals associated with the activate-precharge cycle are generated on the basis of the programmed rate and precharge time with respect to an internal clock of the DRAM device. The activate and precharge signals are coupled to wordlines of the DRAM device, and switched from one wordline to another under internal or external control. One or more functions of the DRAM device are tested while the activate and precharge signals are coupled to wordline.

The manner in which the activate and precharge signals are switched from one wordline to another wordline is configured depending on the type of testing to be conducted. For example, the row address supplied to a row decoder may be incremented (linearly or non-linearly) under external control so that the activate-precharge cycle is executed on the same wordline until a row address increment command is received from an external device. This mode is useful for burn-in WL toggle testing. On the other hand, the row address may be incremented after or in response to every internally generated activate signal. This latter mode is useful when testing the precharge time during burn-in, wafer and component level testing.

Whereas prior art techniques for testing DRAM devices rely on a slow clock rate of an external device (e.g., a burn-in oven), the techniques described herein use the internal clock signal of the memory device to generate the activate and precharge signals, and thus clock rates approaching or equal to the normal operation clock rate of the memory device can be used to generate the activate and precharge signals. Test modes using these programmable rate and precharge techniques allow for much faster wordline toggles during testing.

The precharge time ($T_{RP}$) is the time interval between a precharge command and an activate command and is a critical timing parameter in a DRAM device. Since the toggling of WLs is the result of a sequence of activate commands and precharge commands, the techniques described herein have the additional benefit of testing $T_{RP}$ critically without being limited by the test systems' speed limitations (TDBI systems, wafer and component test systems). In short, these techniques circumvent the test systems' clock limitations by using an on-chip clock, row address counter, and some control modes to increment the row address counter thereby allowing fast WL toggle tests and better test critical precharge test coverage in a DRAM device.

Objects and advantages of the techniques described herein will become more readily apparent when reference is made to the following description taken in conjunction with the accompanying drawings.

DETAILED DESCRIPTION

Figure 1:
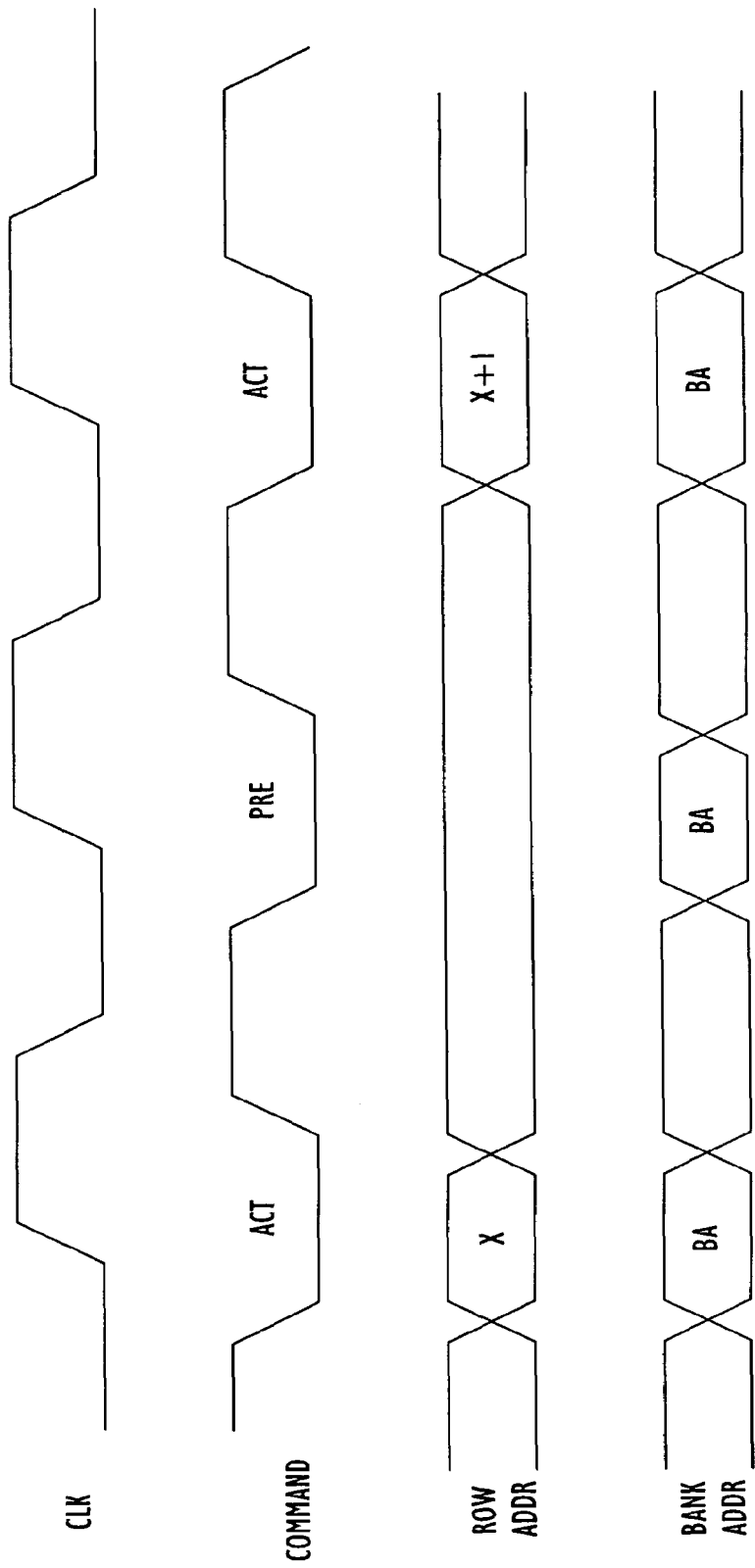
FIG. 1 is a diagram showing how prior art activate-precharge cycles are limited by the external clock rate.
Figure 2:
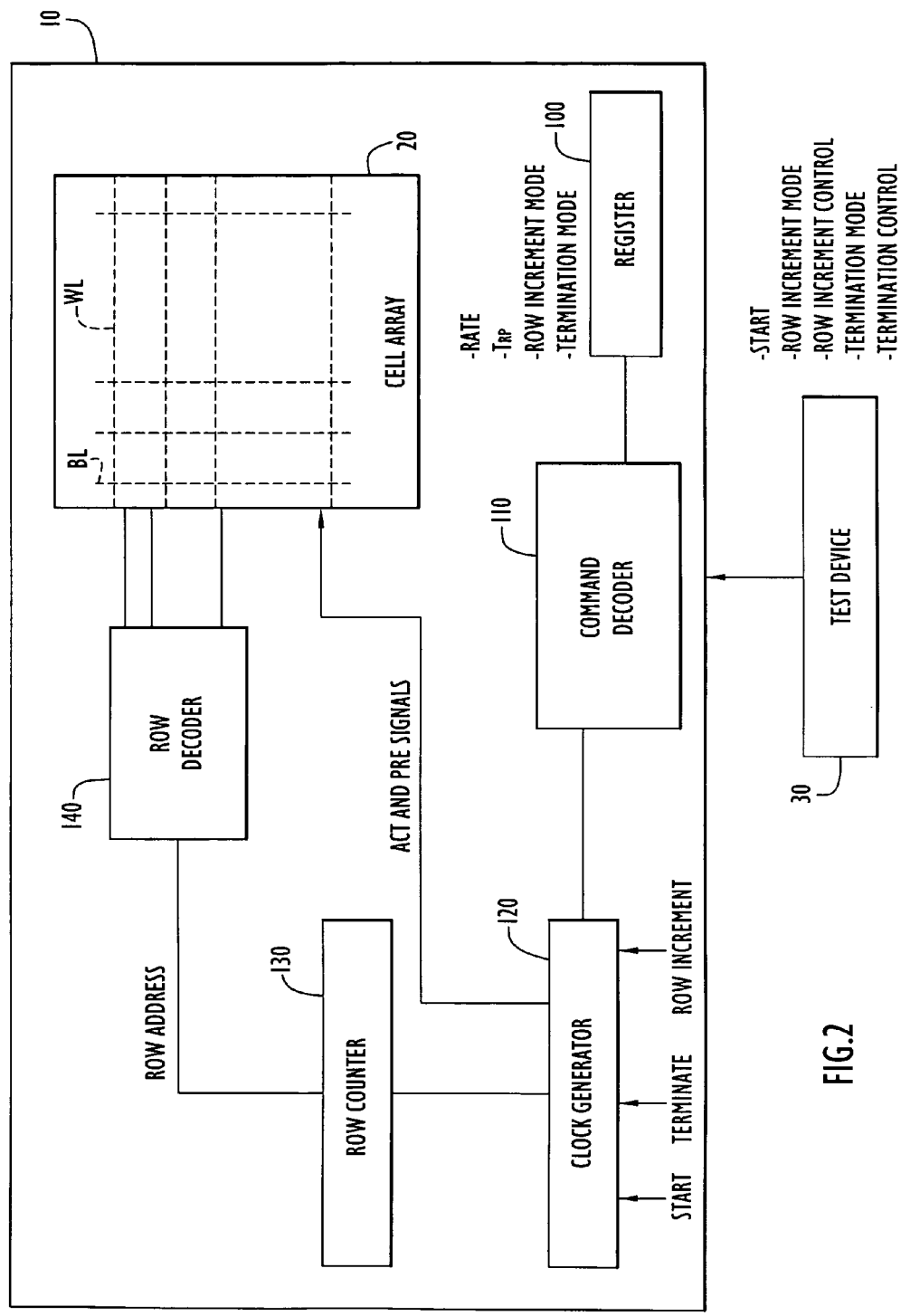
FIG. 2 is a block diagram of a system for providing a faster activate-precharge cycle in a DRAM with programmable parameters.

Referring to FIG. 2, a memory integrated circuit (IC) device, such as a dynamic random access memory (DRAM), is shown at reference numeral 10 together with circuitry to support a programmable activate-precharge cycle. As is known in the art, a memory IC device 10 comprises one or more memory cell banks or arrays, one of which is shown at reference numeral 20. A cell array 20 comprises wordlines (WLs) to address rows of storage cells and bitlines (BLs) to address columns of storage cells. At the intersection of each WL and BL is a storage cell, though for simplicity the individual storage cells are not shown in FIG. 2. An external test device 30 is shown that is used to test the functions of the memory IC 10 at various stages of production. The test device 30 triggers and controls test mode functions of the memory IC 10, and in so doing, may supply signals to control and initiate the test mode functions.

The supporting circuitry for the programmable activate-precharge cycle comprises a register 100 or other means of storing configuration parameters, a command decoder 110, a clock generator 120 and a row counter 130. The register 100 is coupled to the command decoder 110, which in turn is coupled to the clock generator 120. The clock generator 120 supplies a variety of signals, including the activate (ACT) and precharge (PRE) signals of the activate-precharge (ACT-PRE) cycle or loop. In addition, as is known in the art, there is a row decoder 140 that decodes a row address to select a corresponding row in the cell array 20. The register 100 stores values for the programmable configuration parameters associated with an ACT-PRE cycle, including the Rate (also known as the row address strobe time, $T_{RAS}$) and Precharge Time ($T_{RP}$) of an ACT-PRE cycle. The command decoder 110 is essentially a control circuit that takes the contents of the register 100 and supplies control signals to the clock generator 120. The range of the Rate and Precharge Time values programmed into and stored in the register 100 depend on the type of failure tests to be conducted on the memory IC 10. It can range from nanoseconds to microseconds. As is know in the art, the clock generator 120 receives a source clock signal (not shown) from an internal or external clock circuit and produces clock signals at various frequencies required for operation on the memory IC 10.

The register 100 stores configuration values for Rate, $T_{RP}$, row increment mode, and termination mode supplied by, for example, the test device 30. The row increment mode value indicates whether the row counter 130 is to be incremented under internal control or external control. In addition, the row increment mode value may also specify the type of row increment: linear (increment the row address by an integer, e.g., 1, 2, 3, etc., at each increment event) or non-linear (increment the row address in some other fashion, such as a random or other non-linear sequence). Similarly, the termination mode value indicates whether termination of the ACT-PRE cycle is to be under external control or internal control. The test device 30 also supplies a Start command to start the ACT-PRE cycle, a row increment control command (if external row increment control is the configured row increment mode) that causes the row counter 130 to increment the row address that is supplied to the row decoder 140, and a termination control command (if external termination is the configured termination mode) that causes the clock generator 120 to terminate the ACT-PRE cycle. When it is desired to reprogram the memory device, new or different values are written to the register 100 from the test device 30 or other external device.

The clock generator circuit 120 generates a counter increment signal that is coupled to the row counter 130. The row counter 130 is responsive to the counter increment signal to increment a counter value corresponding to a row address of the cell array 20. Thus, the row counter 130 is an example of a means for incrementing a value of a row address that is supplied to the row decoder 140. Based on the values stored in the register 100 for the Rate and precharge time $T_{RP}$, the clock generator circuit 120 generates the ACT command signal and the PRE command signal associated with the ACT-PRE cycle. The ACT command signal and the PRE command signal are coupled to a row (wordline) of the cell array 20 corresponding to the row address output by the row counter.

There are at least two row increment modes of the programmable ACT-PRE cycle: External Increment Mode and Auto Increment Mode. The External Increment Mode is useful during "burn-in" WL toggle testing because, unlike current burn-in WL toggle testing, the techniques described herein are not limited by the slow clock rate of the burn-in oven. The Auto Increment Mode is useful for chip level, component level or wafer level testing situations, as well as for providing long running critical precharge time tests during burn-in. In the External Increment Mode, values are supplied by the test device 30 to set the control of row incrementing by an external command or signal, whereas in the Auto Increment Mode, values are supplied by the test device 30 to set control of row incrementing by an internal command.

As suggested above, the command decoder 110 controls the clock generator circuit 120 to output the internal ACT and PRE command signals according to values for the Rate and $T_{RP}$ stored in the register 100. The command decoder 110 also decodes the row increment mode value stored in the register 100 and when it indicates the External Increment Mode, the command decoder 110 controls the clock generator circuit 120 to generate the counter increment signal on the basis of a row increment signal from an external device, such as the test device 30. The ACT and PRE command signals are coupled to a given wordline until an external row increment command is received. When the command decoder 110 decodes the row increment mode value and it indicates the Auto Increment Mode, the clock generator circuit 120 generates the counter increment based on (or in response to) an internal signal, such as the ACT command signal. For example, the clock generator circuit 120 may increment the row counter 130 substantially in response to each ACT command signal. The Auto Increment Mode is a "free running" mode and allows for setting $T_{RP}$ to values shorter than even wafer level test equipment. This mode can be used to test memory ICs with critical $T_{RP}$ and Rate settings.

Similarly, the command decoder 110 controls the clock generator circuit 130 to terminate the ACT-PRE cycle when the termination mode value stored in the register 100 indicates that termination is to be internally controlled. On the other hand, the command decoder 110 controls the clock generator circuit 120 to be responsive to an external termination command (e.g., from test device 30) to terminate the ACT-PRE cycle when the termination mode value stored in the register 100 indicates termination is to be externally controlled.

Terminating the ACT-PRE cycle may be achieved in one of two ways. In the external termination mode, the ACT and PRE signals are repeatedly coupled to the array until an external device, such as the test device 30, forces an exit by a termination control command. This termination method is useful in burn-in testing in which the ACT-PRE cycle is executed for several seconds and numerous passes through the cell array 20 are required before exiting.

In the internal or auto termination mode, the ACT-PRE cycle is automatically terminated after a programmed number of passes through the cell array 20. Once the programmed number of passes of the ACT-PRE cycle signals through the array 20 is completed, the memory IC 10 automatically enters a self-refresh mode until the test device 30 issues the next external command. Thus, when the internal or auto termination mode is programmed, the test device 30 also supplies data (a value) to program the number of passes through the cell array 20. The command decoder 110 will monitor cycles through the cell array and control the clock generator circuit 120 to terminate the ACT-PRE cycle once the programmed number of passes is reached. This termination method is useful in wafer level or component level testing in which only a few passes through the array are desired, but partial array passes are not acceptable or desired for test coverage reasons.

Figure 3:
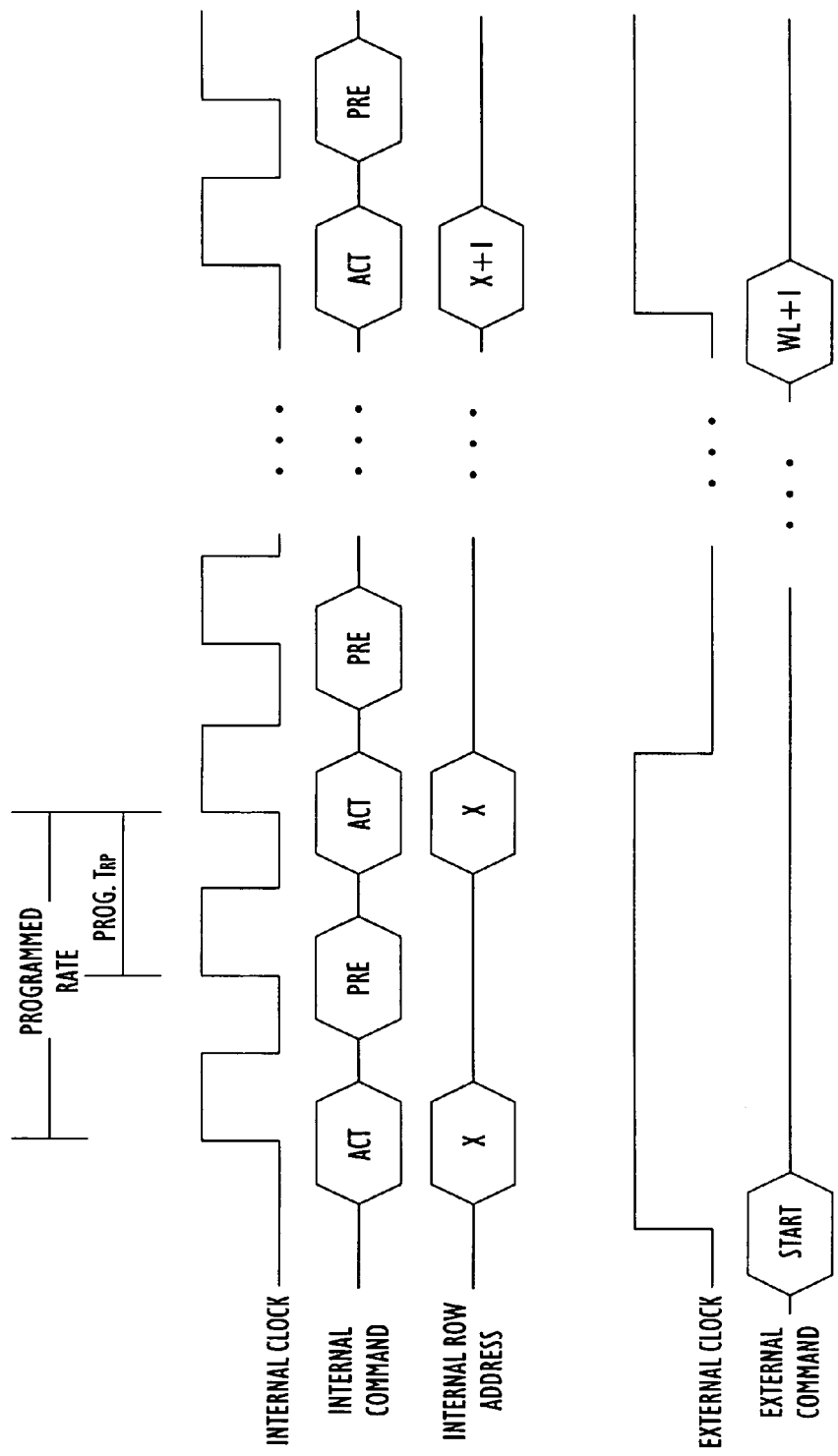
FIG. 3 is a timing diagram for a programmable activate-precharge cycle in an external increment mode.

Turning to FIG. 3 in conjunction with FIG. 2, the External Increment Mode will be described. In this mode, the test device 30 supplies a value for the row increment mode to establish the External Row Increment mode. In addition, values for Rate and $T_{RP}$ are programmed into the register 100 of the device 10. These values set the parameters for the ACT-PRE cycle generated by the clock generator 120. The test device 30 provides a Start command. In response to the Start command, the clock generator circuit 120 generates the ACT and PRE command signals in accordance with the values programmed for Rate and $T_{RP}$. The first row (i.e., first wordline) that is subjected to the ACT and PRE commands will depend on a default or initial value in the row counter 130. ACT and PRE command signals continue to be executed on a given wordline (row of the array 20) at the programmed Rate and $T_{RP}$ time until the test device 30 supplies a command to change to a different wordline, e.g., increment to a different row address. The test device 30 supplies the external row increment command to cause the row counter 130 to increment the value of the row address supplied to the row decoder 140 in order to toggle to a different wordline with the ACT and PRE commands at the programmed Rate and $T_{RP}$. The advantage of this technique is that the toggle rate of the ACT and PRE commands on wordlines is not limited by the clock rate of the test device 30. Rather, the toggle rate is determined by the programmed Rate and $T_{RP}$, generated on the basis of the much faster internal clock of the memory device 10. The test device 30 controls only the rate and timing of switching from one wordline (row address) to another. The test device 30 can control the row counter 130 to increment the row address in a linear or non-linear sequence. Again, this functionality is useful for burn-in WL toggle testing, and allows for much faster wordline toggles than possible with current WL toggle burn-in testing techniques.

Figure 4:
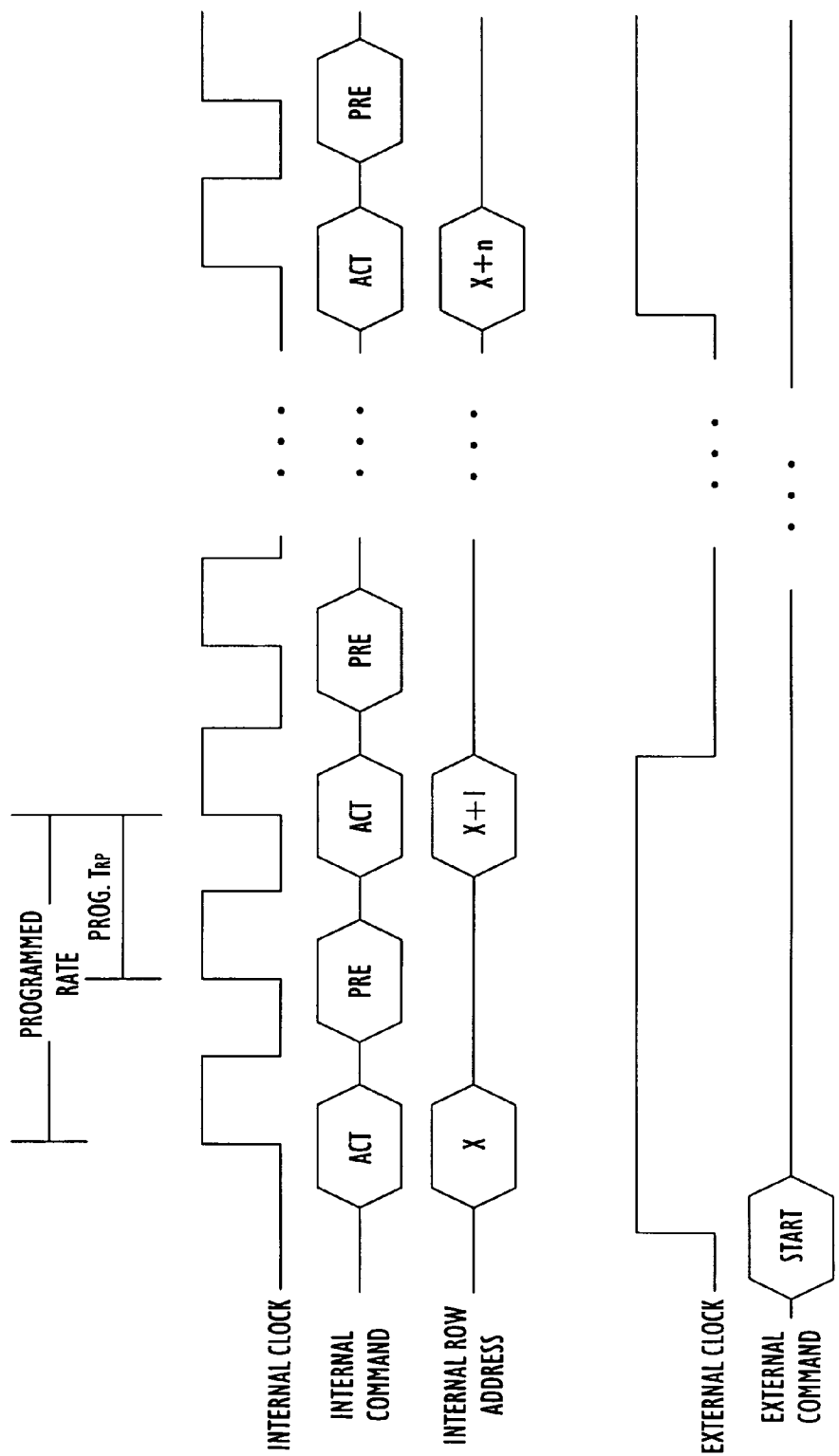
FIG. 4 is a timing diagram for a programmable activate-precharge cycle in an internal auto increment mode.

The Auto Increment Mode is described with reference to FIG. 4 in conjunction with FIG. 2. In this mode, the Rate and $T_{RP}$ are programmed using standard methods described above. If a $T_{RP}$ test is to be performed, then the value of $T_{RP}$ is programmed to a "critical" value, that is, the shortest precharge time that the memory device 10 is to support. The test device 30 supplies the Start command to start the ACT-PRE cycle. The clock generator 120 then generates the ACT and PRE commands according to the programmed Rate and $T_{RP}$. The row counter 130 will automatically increment (linearly or non-linearly) the row address supplied to the row decoder 140 such that a new or different wordline is activated at every ACT command. Thus, the test device 30 will put the memory IC 10 into a "refresh" mode at the programmed Rate and $T_{RP}$.

In sum, a method is provided for testing a memory device comprising programming a rate and a precharge time for activate and precharge signals of an activate-precharge cycle; generating activate and precharge signals with respect to an internal clock of the memory device based on the programmed rate and precharge time; coupling the activate and precharge signals to a wordline of the memory device; and testing one or more functions of the memory device on said wordline during the activate-precharge cycle.

Said another way, a method is provided for testing a memory device comprising: storing values for a rate and a precharge time for activate and precharge signals of an activate-precharge cycle; generating activate and precharge signals with respect to an internal clock of the memory device based on the programmed rate and precharge time; coupling the activate-precharge cycle to a wordline of the memory device; testing one or more functions of the memory device on said wordline during the activate-precharge cycle; and changing to a different wordline and repeating (c) coupling and (d) testing.

Said yet another way, a method for testing a memory device comprising: generating activate and precharge signals with respect to an internal clock of the memory device based on programmed values of the rate and precharge time for the activate and precharge signals; coupling the activate and precharge signals to a wordline of the memory device; testing one or more functions of a wordline of the memory device while the activate and precharge signals are coupled to said wordline at the programmed rate and precharge time; and incrementing a row address corresponding to a different wordline and repeating (b) coupling and (c) testing.

And said another way still, a method is provided for testing a memory device comprising: programming a rate and precharge time for an activate and precharge signals of an activate-precharge cycle; generating the activate and precharge signals for the activate-precharge cycle based on the programmed rate and precharge time and with respect to an internal clock signal of the memory device; and testing one or more functions of the memory device on wordlines of the memory device while the activate and precharge signals are coupled to the respective wordlines.

Similarly, a memory IC device is provided comprising: a register that stores programmable values for a rate and a precharge time of an activate-precharge cycle; a counter circuit that increments a counter value corresponding to a row address in an array of storage cells in response to a counter increment signal; and a clock generator circuit coupled to the counter circuit, wherein the clock generator circuit generates the counter increment signal that is coupled to the counter circuit, and the clock generator circuit generates for coupling to a row of the array corresponding to the row address an activate signal and a precharge command signal associated with an activate-precharge cycle at the programmed rate and precharge.

Further, a memory IC device is provided comprising: an array of memory cells; a register that stores programmable values for a rate and a precharge time of an activate-precharge cycle; a clock generator circuit that generates a counter increment signal, and that generates an activate signal and a precharge signal associated with the activate-precharge cycle based on values for the rate and precharge time stored in the register; a counter circuit coupled to the clock generator circuit that increments a counter value corresponding to the row address to the array of memory cells in response to the counter increment signal; a row decoder responsive to a row address signal that selects a row in the array of memory cells to which the activate and precharge signals are coupled; a command decoder circuit coupled to the register and to the clock generator circuit, wherein the command decoder circuit supplies signals to control the clock generator circuit to output the activate signal and the precharge signal according to values for the rate and precharge time stored in the register.

The device and methods described herein may be embodied in other specific forms without departing from the spirit or essential characteristics thereof. The foregoing embodiments are therefore to be considered in all respects illustrative and not meant to be limiting.

What is claimed is:

1. A method for testing a memory device comprising:
   a. programming for storage in a storage element in the memory device values for a rate and a precharge time for activate and precharge signals of an activate-precharge cycle of the memory device;
   b. generating activate and precharge signals with respect to an internal clock of the memory device based on the programmed values for rate and precharge time;
   c. coupling the activate and precharge signals to a wordline of the memory device; and
   d. testing one or more functions of the memory device on said wordline during the activate-precharge cycle.

2. The method of claim 1, and further comprising coupling the activate and precharge signals to a different wordline, and performing said (d) testing on the different wordline.

3. The method of claim 2, wherein coupling comprises changing a row address associated with a wordline of the memory device.

4. The method of claim 3, wherein changing the row address is responsive to a command received externally from the memory device.

5. The method of claim 4, wherein changing the row address comprises incrementing the row address.

6. The method of claim 5, wherein testing comprises conducting a burn-in wordline toggle test on said wordline of the memory device.

7. The method of claim 3, wherein changing the row address is responsive to the activate signal of the activate-precharge cycle.

8. The method of claim 7, wherein changing the row address comprises changing a row address associated with a wordline of the memory device.

9. The method of claim 8, wherein changing the row address comprises incrementing the row address.

10. The method of claim 7, wherein testing comprises conducting testing the precharge time during at least one of: burn-in testing, wafer testing and component testing.

11. The method of claim 7, wherein changing the row address is responsive to every activate signal of the activate-precharge cycle.

12. The method of claim 1, and further comprising terminating the activate-precharge cycle in response to a command received externally from the memory device.

13. The method of claim 1, and further comprising terminating the activate-precharge cycle after a number of cycles through a cell away of the memory device.

14. The method of claim 1, and further comprising coupling an external test device to the memory device, and supplying from the external test device a start command that initiates said generating of the activate and precharge signals and a row increment mode signal indicating whether row increment is linear or non-linear.

15. The method of claim 14, wherein the row increment mode signal supplied by the external test device further indicates whether row increment is under automatic internal control or under external control from the test device, and wherein supplying further comprises supplying a termination mode signal indicating whether the activation-precharge signal is under external control from the test device or internal control within the memory device.

16. The method of claim 1, wherein the values for rate and precharge time that are programmed for storage in the memory device are for purposes of testing functions of the memory device during an activate-precharge cycle established on the basis of the values for the rate and precharge time.

17. A method for testing a memory device comprising:
a. storing in a storage element of the memory device values for a rate and a precharge time for activate and precharge signals of an activate-precharge cycle of the memory device;
b. generating activate and precharge signals with respect to an internal clock of the memory device based on the values for rate and precharge time;
c. coupling the activate-precharge cycle to a wordline of the memory device;
d. testing one or more functions of the memory device on said wordline during the activate-precharge cycle; and
e. changing to a different wordline and repeating said (c) coupling and said (d) testing.

18. The method of claim 17, wherein changing to a different wordline comprises incrementing the row address.

19. The method of claim 17, wherein changing is responsive to a command received externally from the memory device.

20. The method of claim 19, wherein testing comprises conducting a burn-in wordline toggle test on said wordline of the memory device.

21. The method of claim 17, wherein changing to a different wordline comprises incrementing the row address in response to the activate signal of the activate-precharge cycle.

22. The method of claim 21, wherein testing comprises testing the precharge time during at least one of: burn-in testing, wafer testing and component testing.

23. The method of claim 17, and further comprising coupling an external test device to the memory device, and supplying from the external test device a start command that initiates said generating of the activate and precharge signals and a row increment mode signal indicating whether row increment is linear or non-linear.

24. The method of claim 23, wherein the row increment mode signal supplied by the external test device further indicates whether row increment is under automatic internal control or under external control from the test device, and wherein supplying further comprises supplying a termination mode signal indicating whether the activation-precharge signal is under external control from the test device or internal control within the memory device.

25. The method of claim 17, wherein the values for rate and precharge time that stored in the memory device are for purposes of testing functions of the memory device during an activate-precharge cycle established on the basis of the values for the rate and precharge time.

26. A method for testing a memory device comprising:
a. generating activate and precharge signals with respect to an internal clock of the memory device based on values for a rate and a precharge time for the activate and precharge signals, wherein said values are stored in a storage element in the memory device;
b. coupling the activate and precharge signals to a wordline of the memory device;
c. testing one or more functions of a wordline of the memory device while the activate and precharge signals are coupled to said wordline at the programmed rate and precharge time; and
d. incrementing a row address corresponding to a different wordline and repeating said (b) coupling and said (c) testing.

27. The method of claim 26, wherein incrementing is responsive to a command received externally from the memory device.

28. The method of claim 27, wherein testing comprises conducting a burn-in wordline toggle test on said wordline of the memory device.

29. The method of claim 26, wherein incrementing comprises incrementing the row address in response to the activate signal.

30. The method of claim 29, wherein testing comprises testing the precharge time during at least one of: burn-in testing, wafer testing and component testing.

31. The method of claim 26, and further comprising storing values for the rate and the precharge time of the activate and precharge signals.

32. The method of claim 26, and further comprising coupling an external test device to the memory device, and supplying from the external test device a start command that initiates said generating of the activate and precharge signals and a row increment mode signal indicating whether row increment is linear or non-linear.

33. The method of claim 32, wherein the row increment mode signal supplied by the external test device further indicates whether row increment is under automatic internal control or under external control from the test device, and wherein supplying further comprises supplying a termination mode signal indicating whether the activation-precharge signal is under external control from the test device or internal control within the memory device.

34. The method of claim 26, wherein the values for rate and precharge time that stored in the memory device are for purposes of testing functions of the memory device during an activate-precharge cycle established on the basis of the values for the rate and precharge time.

35. A method for testing a memory device comprising:
   a. programming for storage in a storage element of the memory device values for a rate and a precharge time for activate and precharge signals of an activate-precharge cycle;
   b. generating the activate and precharge signals for the activate-precharge cycle based on the programmed values for rate and precharge time and with respect to an internal clock signal of the memory device; and
   c. testing one or more functions of the memory device on wordlines of the memory device while the activate and precharge signals are coupled to the respective wordlines.

36. The method of claim 35, and further comprising incrementing a row address corresponding to a different wordline and repeating said (c) testing.

37. The method of claim 36, wherein incrementing comprises incrementing the row address in response to an externally generated command.

38. The method of claim 37, wherein the activate and precharge signals are coupled to a given wordline until the externally generated command to increment the row address is received.

39. The method of claim 36, wherein incrementing comprises incrementing the row address in response to an internally generated command.

40. The method of claim 39, wherein incrementing comprises incrementing the row address in response to the activate signal.

41. The method of claim 35, and further comprising coupling an external test device to the memory device, and supplying from the external test device a start command that initiates said generating of the activate and precharge signals and a row increment mode signal indicating whether row increment is linear or non-linear.

42. The method of claim 41, wherein the row increment mode signal supplied by the external test device further indicates whether row increment is under automatic internal control or under external control from the test device, and wherein supplying further comprises supplying a termination mode signal indicating whether the activation-precharge signal is under external control from the test device or internal control within the memory device.

43. The method of claim 35, wherein the values for rate and precharge time that programmed for storage in the memory device are for purposes of testing functions of the memory device during an activate-precharge cycle established on the basis of the values for the rate and precharge time.

* * * * *

UNITED STATES PATENT AND TRADEMARK OFFICE
CERTIFICATE OF CORRECTION

PATENT NO.          : 7,539,911 B2                                          Page 1 of 1
APPLICATION NO. : 11/138462
DATED               : May 26, 2009
INVENTOR(S)        : Robert Perry et al.

It is certified that error appears in the above-identified patent and that said Letters Patent is hereby corrected as shown below:

Column 7, line 25, replace "away" with -- array --

Signed and Sealed this

Fourth Day of August, 2009

JOHN DOLL
*Acting Director of the United States Patent and Trademark Office*